US007012011B2

(12) United States Patent
Chrysler et al.

(10) Patent No.: US 7,012,011 B2
(45) Date of Patent: Mar. 14, 2006

(54) WAFER-LEVEL DIAMOND SPREADER

(75) Inventors: Gregory M. Chrysler, Chandler, AZ (US); Chuan Hu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/876,511

(22) Filed: Jun. 24, 2004

(65) Prior Publication Data

US 2005/0287766 A1 Dec. 29, 2005

(51) Int. Cl.
*H01L 21/00* (2006.01)

(52) U.S. Cl. ...................................... 438/455; 438/105

(58) Field of Classification Search ................ 438/105, 438/455, 459

See application file for complete search history.

(56) References Cited

U.S. PATENT DOCUMENTS

| | | | | |
|---|---|---|---|---|
| 4,981,818 | A * | 1/1991 | Anthony et al. | 438/494 |
| 5,131,963 | A * | 7/1992 | Ravi | 148/33.3 |
| 5,622,586 | A * | 4/1997 | Vaitkus et al. | 156/247 |
| 6,428,399 | B1 * | 8/2002 | Tanabe et al. | 451/66 |

* cited by examiner

*Primary Examiner*—Scott Geyer
(74) *Attorney, Agent, or Firm*—Blakely, Sokoloff, Taylor & Zafman LLP

(57) ABSTRACT

An embodiment of the present invention is a technique to heat spread at wafer level. A silicon wafer is thinned. A chemical vapor deposition diamond (CVDD) wafer processed. The CVDD wafer is bonded to the thinned silicon wafer to form a bonded wafer. Metallization is plated on back side of the CVDD wafer. The CVDD wafer is reflowed to flatten the back side.

11 Claims, 5 Drawing Sheets

WAFER-LEVEL DIAMOND SPREADER

BACKGROUND

1. Field of the Invention

Embodiments of the invention relate to the field of semiconductor, and more specifically, to thermal design.

2. Description of Related Art

The next generation of mobile processors for wireless devices such as personal digital assistants (PDAs), cellular phones, mobile computers, etc. require efficient thermal management. As processor operating frequency increases due to high performance requirements, thermal design for processors operating at high frequencies has become a challenge.

Existing techniques to address the problem of thermal design have a number of disadvantages. One technique uses an integrated heat spreader (IHS) using polycrystalline diamond which is integrated with the device. This technique is slow and costly because the growth of polycrystalline diamond is slow and the amount of diamond needed is large.

BRIEF DESCRIPTION OF THE DRAWINGS

The embodiments of invention may best be understood by referring to the following description and accompanying drawings that are used to illustrate embodiments of the invention. In the drawings.

DESCRIPTION

An embodiment of the present invention is a technique to heat spread at the wafer level. A silicon wafer is fabricated with circuits, partial interconnect structure, and bumps. It is then thinned. A chemical vapor deposition diamond (CVDD) wafer is processed. The CVDD wafer is bonded to the backside of thinned silicon wafer to form a bonded wafer. Metallization is deposited (e.g., via sputtering and plating) on back side of the CVDD wafer. The CVDD wafer is reflowed or polished to flatten the back side.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a procedure, a method of manufacturing or fabrication, etc.

One embodiment of the invention is a technique to provide an electronic package comprising a thinned die with a chemical vapor deposition diamond (CVDD) spreader of the same dimension, and a wafer-level packaging process of diamond spreader. The advantages of the package include reduced cost, small form factor, and very good thermal performance gain. The technique is particularly useful for mobile and/or handheld processors.

Figure 1:
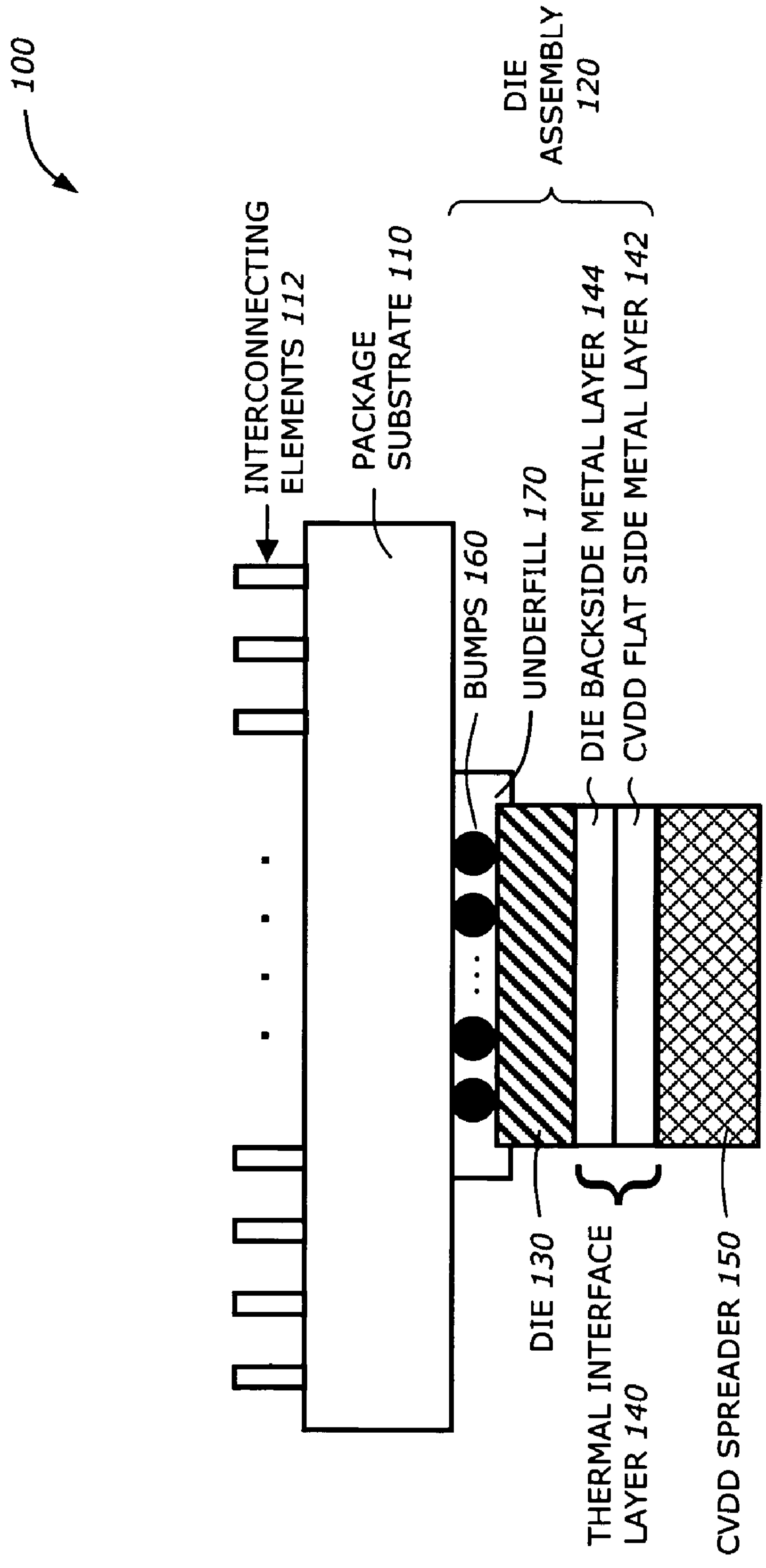
FIG. 1 is a diagram illustrating a device in which one embodiment of the invention can be practiced.

FIG. 1 is a diagram illustrating a device 100 in which one embodiment of the invention can be practiced. The device 100 includes a package substrate 110 and a die assembly 120.

The package substrate 110 is any suitable substrate for packaging. It may be a ceramic substrate or an organic substrate. The package substrate 110 has interconnecting elements 112 to attach the device to a printed circuit board (PCB). Any suitable device packaging technique may be used including Ball Grid Array (BGA), Pin Grid Array (PGA), flip chip technology, etc.

The die assembly 120 includes a die 130, a thermal interface layer 140, and a CVDD spreader 150. Since they are fabricated and bonded at the wafer level and later singulated, the CVDD spreader 150, the thermal interface layer 140, and the die 130 have the same surface dimension. This provides an efficient thermal dissipation and a low cost fabrication process. The die assembly 120 is attached to the package substrate 110 via a plurality of bumps 160 attached to the front side of the die 130. Underfill 170 may be used to provide sealing, encapsulation, or protection for the attachment of the die assembly 120 to the package substrate 110.

The die 130 includes a semiconductor chip or an integrated circuit. In one embodiment, the die 130 is a processor used in mobile or handheld applications. Its thickness may range from 50 $\mu$m to 125 $\mu$m. As is known by one skilled in the art, other thicknesses may also be used.

The thermal interface layer 140 is on the die backside and provides thermal interface between the die 130 and the CVDD spreader 150. Its thickness may range from 5 $\mu$m to 10 $\mu$m. It is contemplated that other thicknesses suitable for fabrication may also be used. It essentially includes two layers: a CVDD flat side metal layer 142 and a die backside metal layer 144. The CVDD flat side metal layer 142 is deposited on the CVDD spreader 150 during the fabrication process of a CVDD wafer from which the CVDD spreader 150 is singulated. The die backside metal layer 144 is deposited on the backside of the die 130. The die backside metal layer 144 and the CVDD flat side metal layer 142 have matched coefficients of thermal expansion (CTEs) and are bonded together at the wafer level.

The CVDD spreader 150 is bonded to the die 130 via the thermal interface layer 140. It provides heat spreading or thermal dissipation for the die 130. The CVDD spreader 150 and the die 130 are bonded together at the wafer level before singulation or dicing. Therefore, the CVDD spreader 150 has the same size or dimension as the die 130, leading to efficient heat spreading. In addition, the process is cost effective.

Figure 2B:
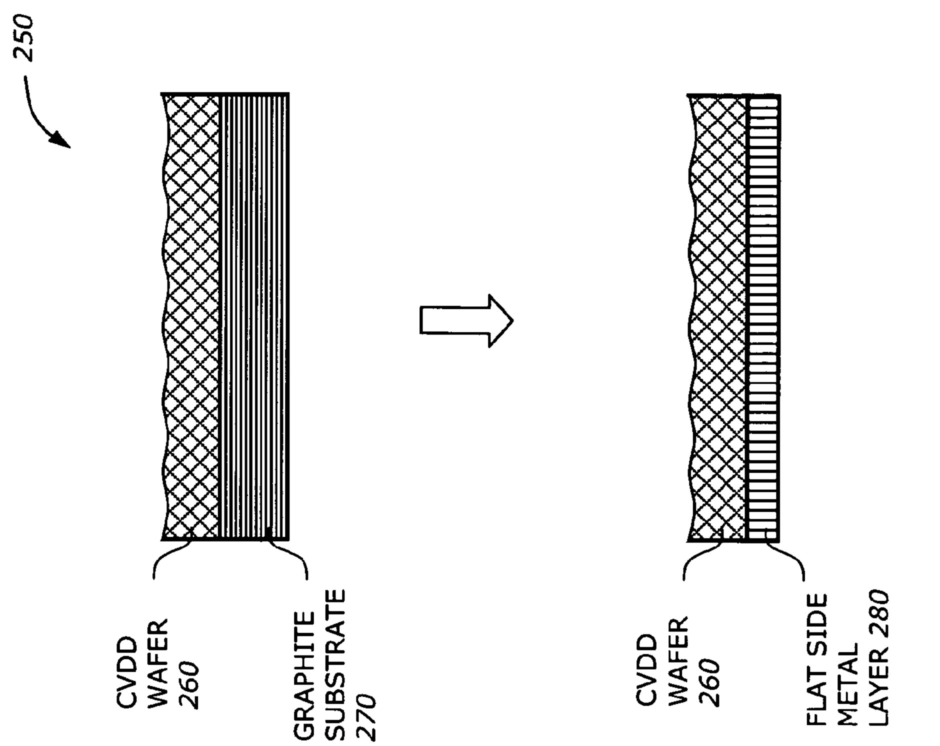
FIG. 2B is a diagram illustrating a chemical vapor deposition diamond (CVDD) wafer according to one embodiment of the invention.
Figure 2A:
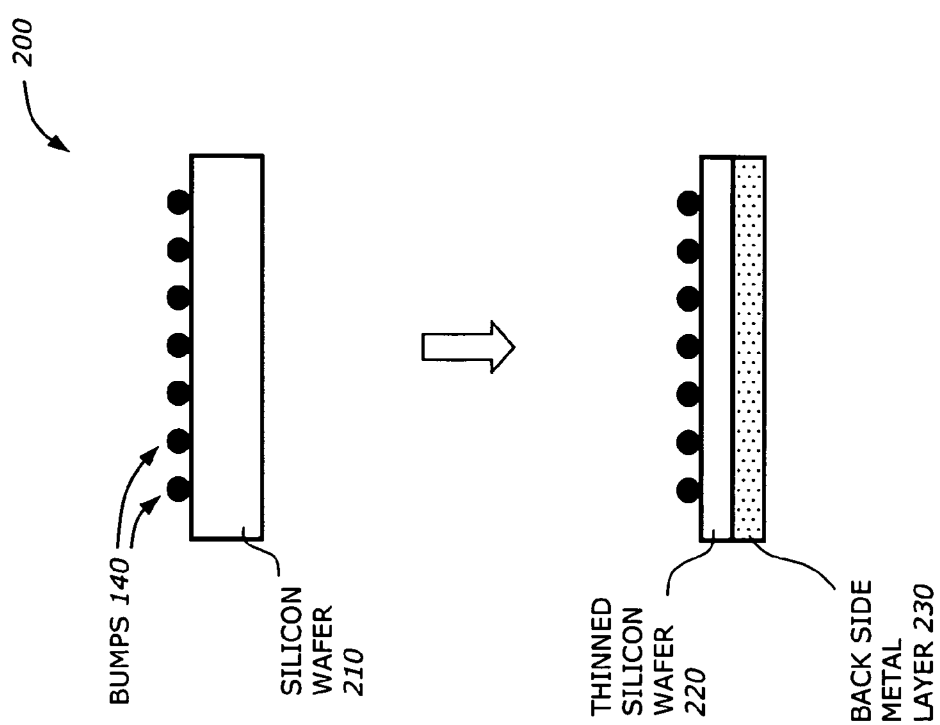
FIG. 2A is a diagram illustrating a silicon wafer according to one embodiment of the invention.

FIG. 2A is a diagram illustrating a silicon wafer 200 according to one embodiment of the invention. The silicon wafer 200 includes a processed silicon wafer 210 and the plurality of bumps 140.

The processed silicon wafer 210 is a silicon wafer that is processed in accordance to traditional circuit fabrication processing. Typical processing stages are performed depending on the applications and designs. For example, the processing stages may include photo masking, etching, diffusion, ion implantation, metal deposition, and passivation.

The processed silicon wafer 210 is then thinned on the backside to become a thinned silicon wafer 220. Any suitable thinning technique may be used such as mechanical grinding, chemical mechanical polishing (CMP), wet etching and atmospheric downstream plasma (ADP), and dry chemical etching (DCE). The thickness of the thinned silicon wafer 220 may range from 50 μm to 125 μm. Thereafter, a backside metal layer 230 is formed by depositing appropriate metallization materials with suitable thicknesses. In one embodiment, the backside metal layer includes titanium (Ti) layer (100 nm), nickel vanadium (NiV) layer (400 nm), and gold (Au) layer (100 nm). It is contemplated that other materials and different thicknesses may be used. When the silicon wafer is singulated into die as will be explained later, the backside metal layer 230 becomes the die backside metal layer 144 shown in FIG. 1.

FIG. 2B is a diagram illustrating a chemical vapor deposition diamond (CVDD) wafer 250 according to one embodiment of the invention. The CVDD wafer 250 includes a polycrystalline CVDD layer 260 and a graphite substrate 270.

The polycrystalline CVDD layer 260 is grown on the graphite substrate 270 with a matched CTE. The thickness of the polycrystalline CVDD layer 260 may be approximately 250 μm. As is known by one skilled in the art, other thicknesses for the CVDD layer 260 may also be used. After growing, the polycrystalline CVDD layer 260 is cleaved from the graphite substrate 270. Metallization on the flat side of the CVDD layer 260 is performed to provide the flat side metal layer 280 for bonding to the backside metal layer 230 of the silicon wafer 200 shown in FIG. 2A. In one embodiment, the flat side metal layer 280 includes a stack of nickel (Ni) with 3 μm thickness, gold (Au) with 3 μm thickness, and tin (Sn) with 3 μm thickness. It is contemplated that other materials and different thicknesses may be used. When the CVDD wafer 250 is singulated into die as will be explained later, the flat side metal layer 280 becomes the CVDD flat side metal layer 142 shown in FIG. 1.

The CVDD wafer 250 and the silicon wafer 200 are processed separately and independently. This provides flexibility and cost efficiency in wafer processing and preparation.

Figure 3:
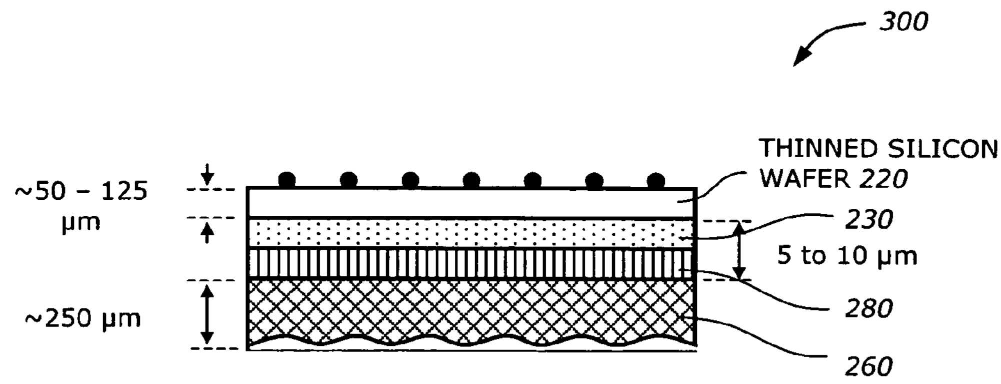
FIG. 3 is a diagram illustrating a bonded wafer according to one embodiment of the invention.

FIG. 3 is a diagram illustrating a bonded wafer 300 according to one embodiment of the invention. The bonded wafer 300 is formed by bonding the CVDD wafer 250 to the thinned silicon wafer 200. The flat side metal layer 280 of the CVDD wafer 250 is bonded to the backside metal layer 230 of the thinned silicon wafer 200. The heat spreading is efficient because the two metal layers have matched CTEs.

Figure 4:
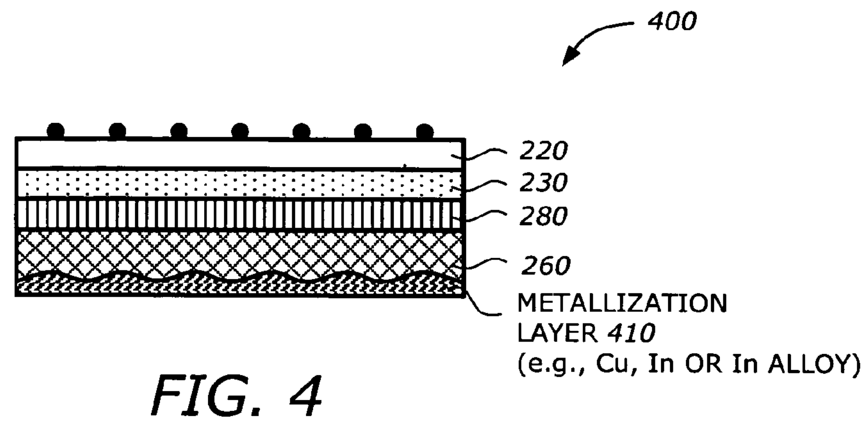
FIG. 4 is a diagram illustrating a flattened bonded wafer according to one embodiment of the invention.

FIG. 4 is a diagram illustrating a flattened bonded wafer 400 according to one embodiment of the invention.

The backside of the CVDD wafer 250 is still rough and not smooth. To flatten the surface of the rough polycrystalline diamond, a metallization layer 410 is plated on the backside of the CVDD wafer 250 and reflow is carried out. This significantly lowers the polish requirement of diamond, leading to lowered cost and increased throughput. In one embodiment, the flattening metallization material may be copper (Cu), indium (In), or In alloy with low melting temperature. The metallization on the backside of CVDD wafer 250 provides a surface to bond with other components in a system such as heat pipe and smoothes the CVDD surface.

Figure 5:
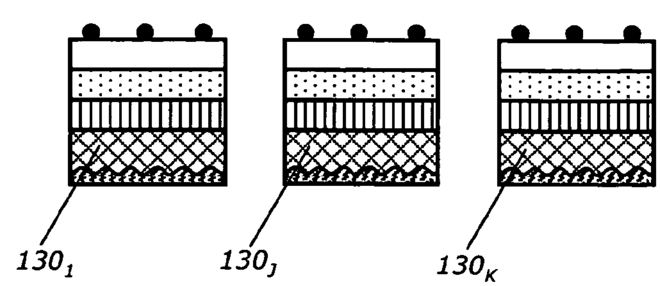
FIG. 5 is a diagram illustrating singulation of the bonded wafer according to one embodiment of the invention.

FIG. 5 is a diagram illustrating singulation of the flattened bonded wafer according to one embodiment of the invention.

After the bonded wafer is formed, flattened, and reflowed, it is singulated into individual dies $\mathbf{130}_i$(i=1, . . . , K). In one embodiment, laser saw is used for singulation. The individual dies are attached to package substrate as shown in FIG. 1 to form a packaged device. After singulation, the CVDD wafer 250 is singulated into the CVDD spreader 150 and the silicon wafer 200 is singulated into the die 130 as shown in FIG. 1. Since the CVDD spreader 150 has the same size as the die 130, it can therefore provide efficient heat spreading. The overall thickness of the die 130, the thermal interface layer 140, and the CVDD spreader 150 is less than 400 μm, which is much lower than a plan of record (POR) silicon die alone. This provides further form factor advantage which is useful for mobile or handheld processor designs.

Figure 6:
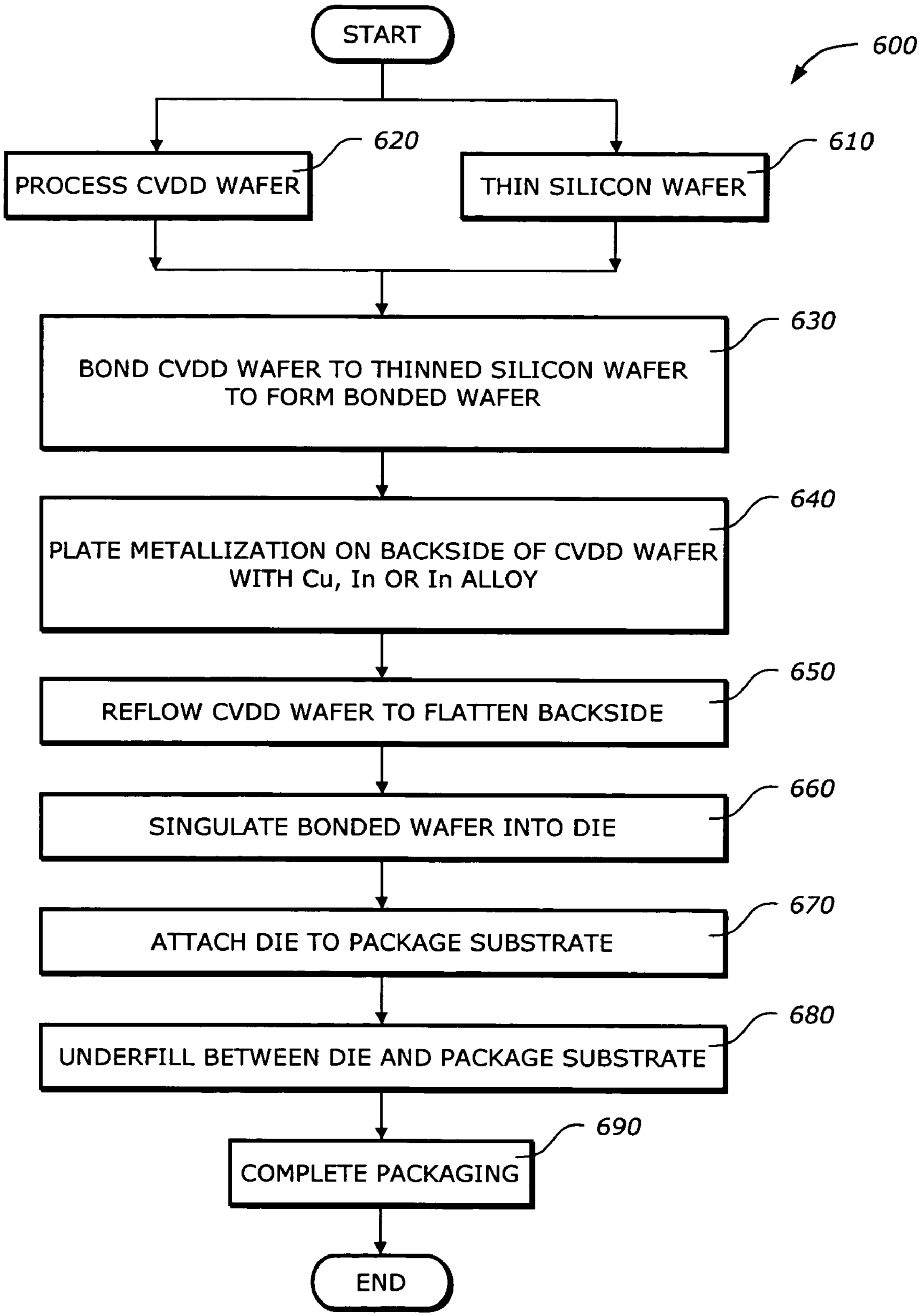
FIG. 6 is a flowchart illustrating a process to form a package device with a CVDD spreader according to one embodiment of the invention.

FIG. 6 is a flowchart illustrating a process 600 to form a package device with a CVDD spreader according to one embodiment of the invention.

Upon START, the process 600 thins a silicon wafer (Block 610) and processes a CVDD wafer (Block 620). The two procedures are performed separately and independently. Next, the process 600 bonds the CVDD wafer to the thinned silicon wafer to form a bonded wafer (Block 630).

Then, the process 600 plates metallization on the backside of the CVDD wafer (Block 640). In one embodiment, the metallization material is copper (Cu), Indium (In) or an In alloy with a low melting temperature. Next, the process 600 reflows the CVDD wafer to flatten the back side (Block 650).

Then, the process 600 singulates the bonded wafer into dies (Block 660). Next, the process 600 attaches individual dies to package substrates (Block 670). Then, the process 600 underfills the space between the dies and the package substrate (Block 680). Next, the process 600 completes the packaging such as performing a second level cooling (e.g., heat pipe and remote heat exchange) as is currently done (Block 690) and is then terminated.

Figure 7:
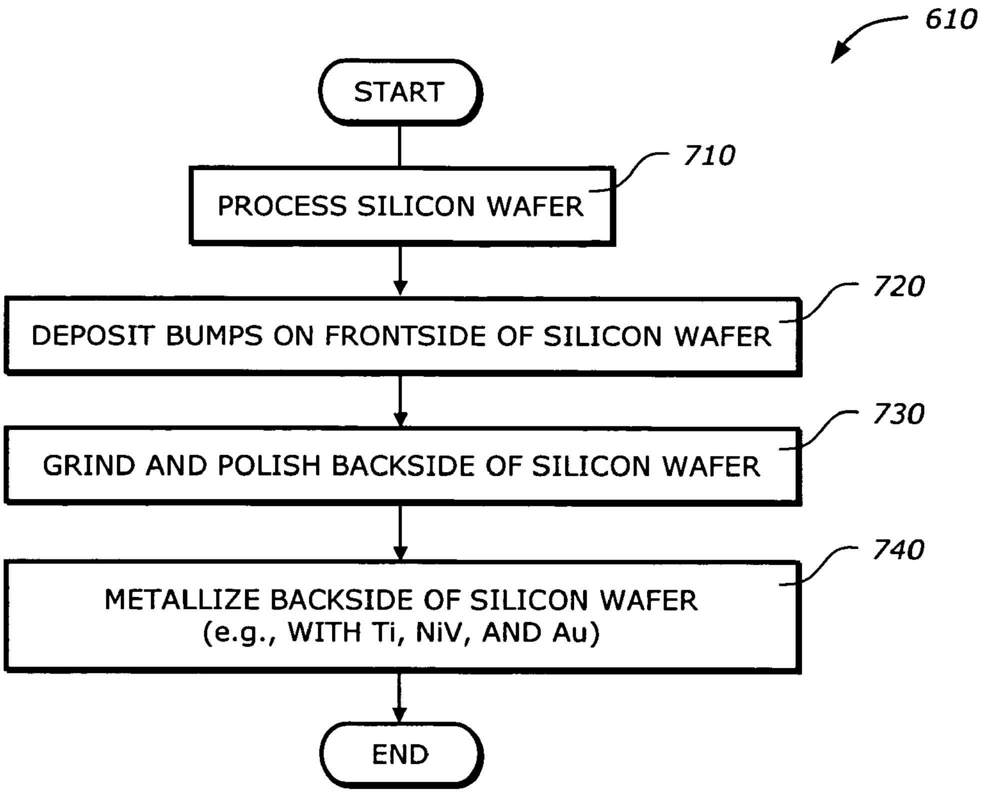
FIG. 7 is a flowchart illustrating a process to thin the silicon wafer according to one embodiment of the invention.

FIG. 7 is a flowchart illustrating the process 610 to thin the silicon wafer according to one embodiment of the invention.

Upon START, the process 610 processes the silicon wafer (Block 710) with standard processing stages such as photo masking, etching, diffusion, ion implantation, metal deposition, and passivation. Next, the process 610 deposits bumps on the front side of the silicon wafer for interconnection (Block 720). Then, the process 610 grinds and polishes the backside of the silicon wafer to thin it to a desired thickness (Block 730). In one embodiment, the thinned thickness ranges from 50 μm to 125 μm. Next, the process 610 metallizes the backside of the thinned silicon wafer (Block 710) with suitable metallization materials and thicknesses such as Ti, NiV, and Au.

Figure 8:
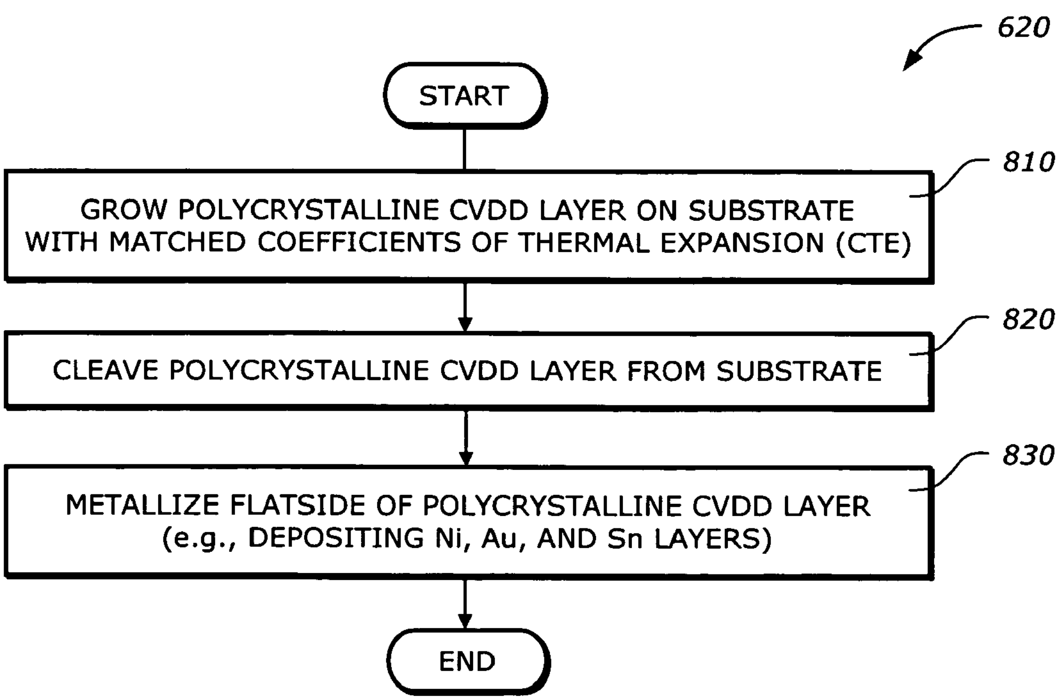
FIG. 8 is a flowchart illustrating a process to process the CVDD wafer according to one embodiment of the invention.

FIG. 8 is a flowchart illustrating the process 620 to process the CVDD wafer according to one embodiment of the invention.

Upon START, the process 620 grows a polycrystalline CVDD layer on a graphite substrate with matched CTE (Block 810). The CVDD layer may have a thickness of approximately 250 μm. Next, the process 620 cleaves the polycrystalline CVDD layer from the graphite substrate (Block 820). Then, the process 620 metallizes the flat side of the polycrystalline CVDD layer by depositing appropriate metallization materials (e.g., Ni, Au, and Sn). The process 620 is then terminated.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:

thinning a silicon wafer;

processing a chemical vapor deposition diamond (CVDD) wafer;

bonding the CVDD wafer to the thinned silicon wafer to form a bonded wafer;

plating metallization on back side of the CVDD wafer; and reflowing the CVDD wafer to flatten the back side.

2. The method of claim 1 further comprising:

singulate the bonded wafer into die.

3. The method of claim 2 further comprising:

attaching the die to a package substrate;

underfilling the die and the package substrate.

4. The method of claim 1 wherein thinning the silicon wafer comprises:

processing the silicon wafer;

depositing bumps on front side of the silicon wafer;

grinding and polishing backside of the silicon wafer; and metallizing the backside of the silicon wafer.

5. The method of claim 4 wherein metallizing the backside comprises:

metallizing the backside of the silicon wafer with Ti, NiV, and Au.

6. The method of claim 1 wherein processing the CVDD wafer comprises:

growing polycrystalline CVDD layer on a substrate with a matched coefficient of thermal expansion (CTE);

cleaving the polycrystalline CVDD layer from the substrate; and metallizing flat side of the polycrystalline CVDD layer.

7. The method of claim 6 wherein growing comprises:

growing the polycrystalline CVDD layer having a thickness of approximately 250 microns.

8. The method of claim 6 wherein metallizing the flat side comprises:

depositing a stack of Ni, Au, and Sn.

9. The method of claim 6 wherein bonding the CVDD wafer to the thinned silicon wafer comprises:

bonding the flat side to the thinned silicon wafer.

10. The method of claim 1 wherein reflowing comprises:

reflowing the CVDD wafer with one of copper (Cu), indium (In), and In alloy.

11. The method of claim 1 wherein bonding the CVDD wafer comprises:

bonding the CVDD wafer to the thinned silicon wafer to form a bonded wafer after circuit fabrication of the silicon wafer.

* * * * *